(12) United States Patent
Chen

(10) Patent No.: US 8,201,003 B2
(45) Date of Patent: Jun. 12, 2012

(54) CIRCUIT FOR PREVENTING COMPUTER POWER DOWN SEQUENCE FAILURE

(75) Inventor: Qi-Jie Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 419 days.

(21) Appl. No.: 12/556,786

(22) Filed: Sep. 10, 2009

(65) Prior Publication Data

US 2010/0313049 A1    Dec. 9, 2010

(30) Foreign Application Priority Data

Jun. 3, 2009   (CN) .......................... 2009 1 0302891

(51) Int. Cl.
   G06F 1/00   (2006.01)
   G06F 1/26   (2006.01)
   G06F 1/32   (2006.01)
   G06F 11/30  (2006.01)

(52) U.S. Cl. ..................... 713/320; 713/300; 713/340

(58) Field of Classification Search ............ 713/300, 713/320, 340
   See application file for complete search history.

(56) References Cited

U.S. PATENT DOCUMENTS

| 5,938,771 A  * | 8/1999  | Williams et al. ........... 713/310 |
| 6,347,379 B1 * | 2/2002  | Dai et al. .................. 713/320 |
| 6,654,896 B1 * | 11/2003 | Saunders et al. ........... 713/323 |

* cited by examiner

Primary Examiner — Mark Connolly
(74) Attorney, Agent, or Firm — Altis Law Group, Inc.

(57) ABSTRACT

A circuit for confirming a correct computer power down sequence includes a Southbridge chip, a first switching transistor circuit, and a second switching transistor circuit. The first switching transistor circuit receives a power good signal. The second switching transistor circuit receives a S3 sleep signal. The first and second switching transistor circuits have a common output node coupled to the Southbridge chip. During a computer power down sequence, the S3 sleep signal is set from high to low before than the power good signal, and the S3 sleep signal is active and fed to the Southbridge chip, thereby quickly providing a low level power good signal to the Southbridge chip and confirming the power down sequence is correct.

19 Claims, 3 Drawing Sheets

CIRCUIT FOR PREVENTING COMPUTER POWER DOWN SEQUENCE FAILURE

BACKGROUND

1. Technical Field

The present disclosure relates to a circuit for preventing a computer power down sequence failure.

2. Description of Related Art

The micro ATX and ATX specifications recommend a 24-pin main connector interface for power supply. This interface incorporates standard ±5V, ±12V, 3.3V, 5V standby, and soft-power signals. Proper implementation of PSON#, 5 VSB, and PG (Power GOOD or Power OK) is required for an ATX-compliant power supply.

During a computer power up sequence, a Southbridge chip of an ATX motherboard receives a PWRBTN# (Power Button) signal and then sends a high level SLP_S3# (S3 Sleep) signal to a PSON# pin of a power connector of an ATX power supply. Then the power supply turns on all of the main power rails including 3.3V, 5V, −5V, 12V, and −12V power rails. After the power rails are powered up and stable, a PG pin of the power connector sends a high level PG signal to the Southbridge. There must be a time delay (100 ms~500 ms) between the power rails and PG signal to conform to a specified computer power up sequence. After the Southbridge chip receives the high level PG signal, the Southbridge chip sends a reset signal to a CPU. Then, components on the motherboard are all powered up and capable of normally working.

During a computer power down sequence, the PG signal on a PG (Power Good) pin of the Southbridge chip must go to low level before the power rails are powered down. However, the PG signal on the PG (Power Good) pin of the Southbridge chip is often unstable and sometimes does not fall to low level, thereby causing the computer power down sequence to fail.

Therefore, a circuit for quickly setting the PG signal of the Southbridge chip to low level and preventing power down sequence failure is desired.

DETAILED DESCRIPTION OF THE EMBODIMENTS

Figure 1:
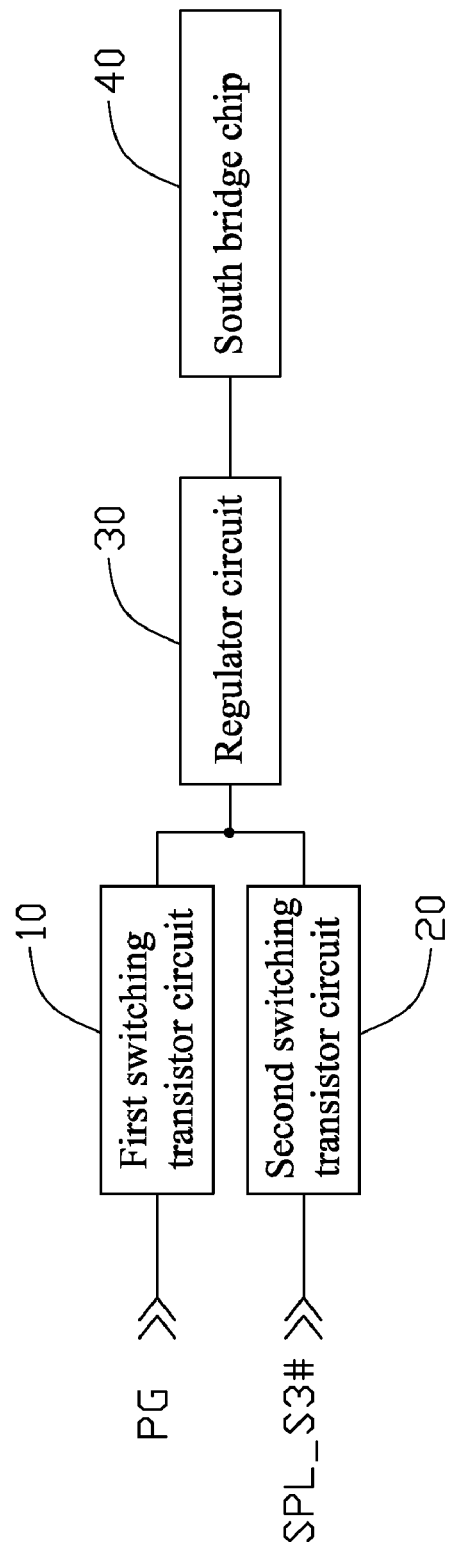
FIG. 1 illustrates a block diagram of a circuit for preventing a computer power down sequence failure in accordance with the present disclosure.

Referring to FIG. 1, an embodiment of a circuit in an electronic device (such as a computer) for preventing the computer power down sequence failure includes a first switching transistor circuit 10, a second switching transistor circuit 20, a regulator circuit 30, and a Southbridge chip 40. The first switching transistor circuit 10 has an input terminal receiving a power good (PG) signal from a Super I/O chip of a motherboard (not shown). The second switching transistor circuit 20 has an input terminal receiving a S3 sleep (SLP_S3#) signal from the Southbridge chip 40. The first and second switching transistor circuits 10, 20 have a common output node connected to an input terminal of the regulator circuit 30. An output terminal of the regulator circuit 30 is connected to a PG pin of the Southbridge chip 40.

Figure 2:
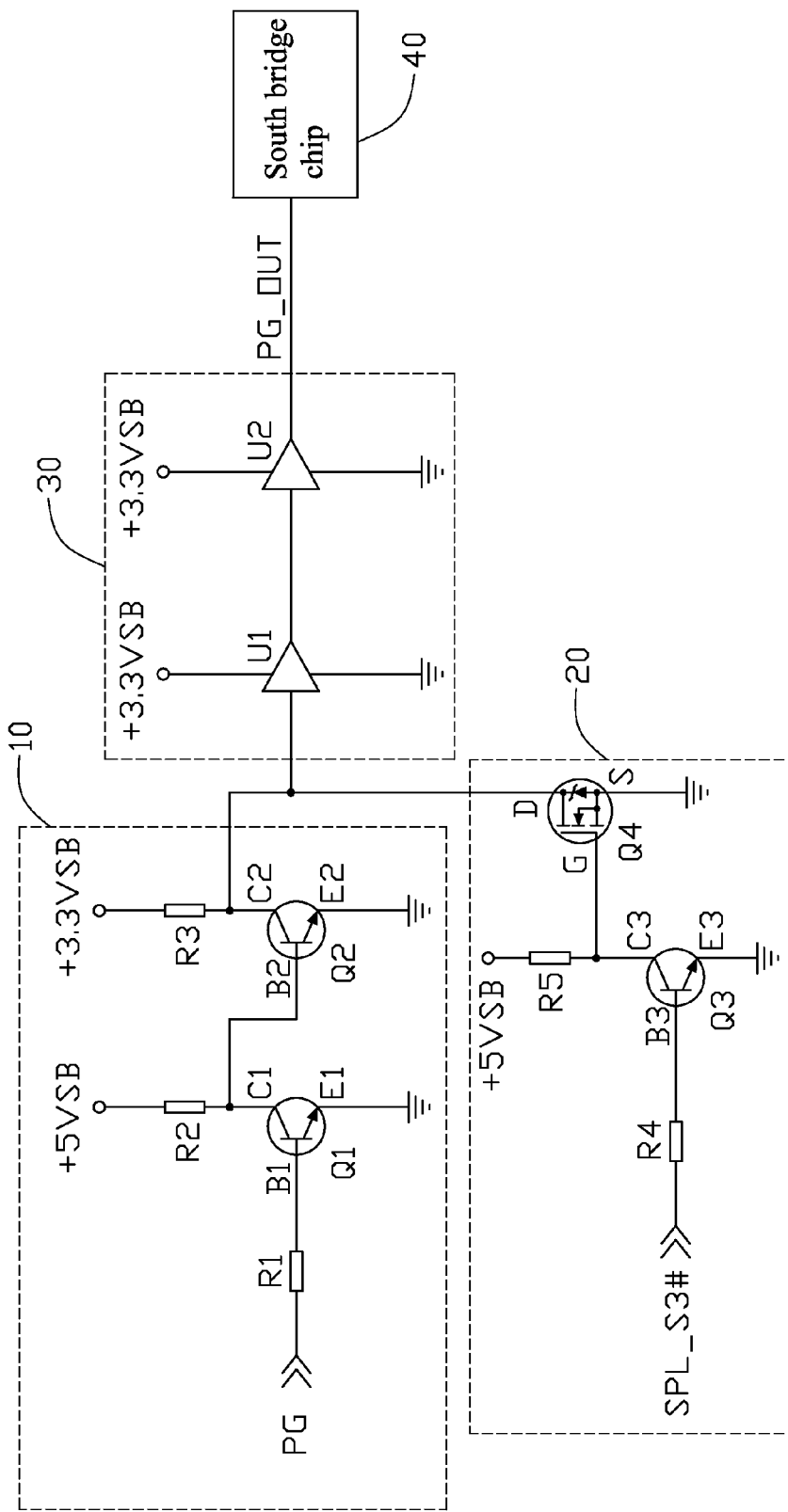
FIG. 2 illustrates a circuit diagram of the circuit for preventing a computer power down sequence failure in accordance with the present disclosure.

Referring to FIG. 2, the first switching transistor circuit 10 includes a first transistor Q1 and a second transistor Q2. The first transistor Q1 and the second transistor Q2 are both NPN bipolar transistors. A base terminal B1 of the first transistor Q1 is configured to receive the PG signal via a first resistor R1, a collector terminal C1 of the first transistor Q2 is coupled to a standby signal (+5 VSB) via a second resistor R2, and an emitter terminal E1 of the first transistor Q1 is connected to ground. A base terminal B2 of the second transistor Q2 is connected to the collector terminal C1 of the first transistor Q1, a collector terminal C2 of the second transistor Q2 is coupled to a second standby signal (+3.3 VSB) via a third resistor R3 and connects to the common output node A, and an emitter terminal E2 of the second transistor Q2 is connected to ground. The base terminal B1 is a control terminal of the first transistor Q1, and the base terminal B2 is a control terminal of the second transistor Q2. In the embodiment, a signal on the control terminal of the first transistor Q1 is at an opposite logic level to that on the control terminal of the second transistor Q2. Thus, one of the first transistor Q1 and the second transistor Q2 is switched on, while another one of the first transistor Q1 and the second transistor Q2 is switched off.

The second switching transistor circuit 20 includes a third transistor Q3 and a fourth transistor Q4. The third transistor Q3 is an NPN bipolar transistor, and the fourth transistor Q4 is an N-channel enhancement MOSFET. A base terminal B3 of the third transistor Q3 is configured to receive the S3 sleep (SLP_S3#) signal via a fourth resistor R4, a collector terminal C3 of the third transistor Q3 is coupled to a standby signal (+5 VSB) via a fifth resistor R5, and an emitter terminal E3 of the third transistor Q3 is connected to ground. A gate terminal G of the fourth transistor Q4 is connected to the collector terminal C3 of the third transistor Q3, a drain terminal D of the fourth transistor Q4 is coupled to the output node A, and a source terminal S of the fourth transistor Q4 is connected to ground. The base terminal B3 is a control terminal of the third transistor Q3, and the gate terminal G is a control terminal of the fourth transistor Q4. In the embodiment, a signal on the control terminal of the third transistor Q3 is at an opposite logic level to that on the control terminal of the fourth transistor Q4. Thus, one of the third transistor Q3 and the fourth transistor Q4 is switched on, while another one of the third transistor Q3 and the fourth transistor Q4 is switched off.

The regulator circuit 30 includes a first inverter (NOT gate) U1 and a second inverter (NOT gate) U2 serially connected to the first inverter U1. Each of the first inverter U1 and the second inverter U2 is coupled between a standby power supply (+3.3 VSB) and ground terminal. The first inverter U1 converts the signal on the node A (from high/low level to low/high level) and outputs a converted signal to the second inverter U2. The second inverter U2 converts the output signal of the first inverter U1 (from low/high level to high/low level). Thus, the regulator circuit 30 sends out a signal having the same logic level as the signal on the node A. The first inverter U1 and the second inverter U2 are capable of generating a square wave signal without any falling/rising delay for regulating the signal on the node A and sending a regulated signal to the PG pin of the Southbridge chip 40.

Figure 3:
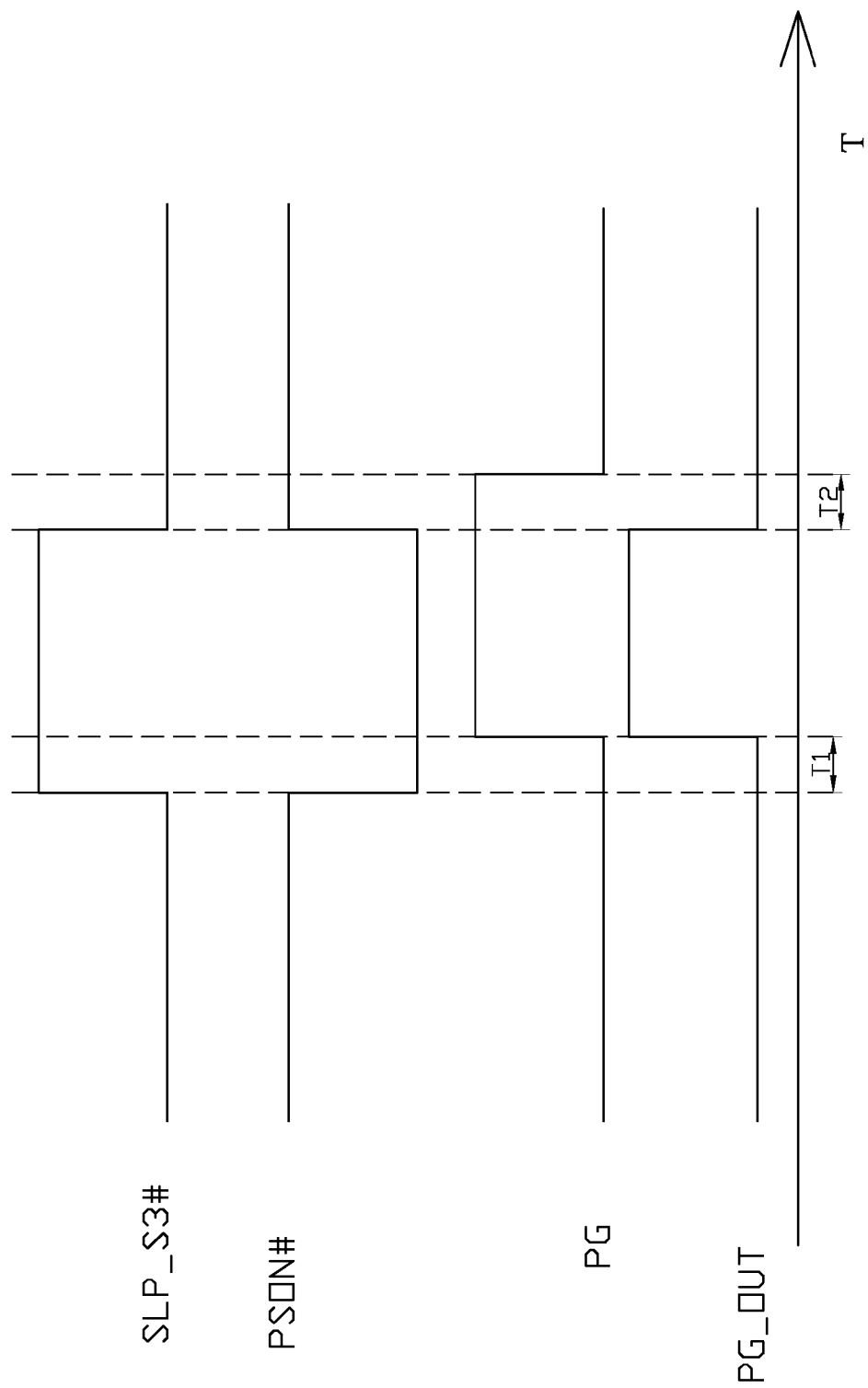
FIG. 3 illustrates a timing diagram explaining the operation of the circuit in FIG. 2.

Referring to FIG. 3, during a computer power up sequence, the SLP_S3# signal is set from low to high level. The PSON# signal is set from high to low level. The PG signal is set from low to high level after a time delay T1. During the time delay period T1, the SLP_S3# signal is at high level, and the PG signal is at low level. The transistor Q1 is rendered nonconductive, and a collector terminal C1 of the transistor Q1 is at high level to render the transistor Q2 conductive. Thus, the signal on the node A (output PG signal) is connected to ground via the conductive transistor Q2 and at a low level. During the power up sequence, the PG signal is active and sent to the PG pin of the Southbridge chip 40, and the output PG signal sent to the Southbridge chip 40 is synchronous with the PG signal and keeps the time delay T1 for conforming to the power up sequence requirement.

During a computer power down sequence, the SLP_S3# signal is set from high to low level. The PSON# signal is set from low to high level. The PG signal is set from high to low level after a time delay T2. During the time delay period T2, the SLP_S3# signal has fallen low, and the PG signal is still at high level. The transistor Q3 is rendered non-conductive, and a collector terminal C3 of the transistor Q3 is at high level to render the transistor Q4 conductive. Thus, the signal on the node A (output PG signal) is connected to ground via the conductive transistor Q4 and at a low level. During the power down sequence, the SLP_S3# signal is active and sent to the PG pin of the Southbridge chip 40, and the output PG signal sent to the Southbridge chip 40 is synchronous with the SLP_S3# signal and does not have the time delay T2. Thus, a low level output PG signal is quickly sent to the PG pin of the Southbridge chip 40 and the power rails (+5V, +12V, 3.3V, 5V) can be powered down.

In the embodiment, during the computer power down sequence of the electronic device, the S3 sleep (SPL_S3#) signal falls low before than the power good signal, and the S3 sleep signal is active and fed to the power good pin of the Southbridge chip 40, thereby decreasing a delay time of the power good signal fed to the Southbridge chip 40 and confirming the power down sequence is correct.

While the present disclosure has illustrated by the description preferred embodiments, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

The invention claimed is:

1. A circuit of an electronic device, comprising:
a Southbridge chip comprising a power good pin, a signal on the power good pin of the chip related to a computer power up/down sequence of the electronic device;
a first switching transistor circuit with an input terminal to receive a power good signal, and an output terminal connected to the power good pin of the Southbridge chip of the electronic device; and
a second switching transistor circuit with an input terminal to receive a S3 sleep signal, and an output terminal connected to the power good pin of the Southbridge chip;
wherein during the computer power down sequence of the electronic device, the S3 sleep signal falls low before the power good signal, and the S3 sleep signal is active and fed to the power good pin of the Southbridge chip, thereby decreasing a delay time of the power good signal fed to the Southbridge chip and confirming the power down sequence is correct.

2. The circuit of claim 1, wherein the first switching transistor circuit comprises a first transistor and a second transistor, a signal on a control terminal of the first transistor is at an opposite logic level to that on a control terminal of the second transistor; one of the first transistor and the second transistor is rendered conductive, and another one of the first transistor and the second transistor is rendered non-conductive.

3. The circuit of claim 2, wherein first transistor and the second transistor are both NPN bipolar transistors.

4. The circuit of claim 3, wherein a base terminal of the first transistor is configured to receive the power good signal via a first resistor, a collector terminal of the first transistor is coupled to a direct current power supply via a second resistor, and an emitter terminal of the first transistor is connected to ground.

5. The circuit of claim 4, wherein a base terminal of the second transistor is connected to the collector terminal of the first transistor, a collector terminal of the second transistor is coupled to another direct current power supply via a third resistor and connects to an output node of the first switching transistor circuit and the second switching transistor circuit, and an emitter terminal of the second transistor is connected to ground.

6. The circuit of claim 1, wherein the second switching transistor circuit comprises a third transistor and a fourth transistor, a signal on a control terminal of the first transistor is at an opposite logic level to that on a control terminal of the second transistor; one of the third transistor and the fourth transistor is rendered conductive, and another one of the third transistor and the fourth transistor is rendered non-conductive.

7. The circuit of claim 6, wherein the third transistor is an NPN bipolar transistor, and the fourth transistor is an N-channel enhancement MOSFET.

8. The circuit of claim 7, wherein a base terminal of the third transistor is configured to receive the S3 sleep signal via a fourth resistor, a collector terminal of the third transistor is coupled to a direct current power supply via a fifth resistor, and an emitter terminal of the third transistor is connected to ground.

9. The circuit of claim 8, wherein a gate terminal of the fourth transistor is connected to the collector terminal of the third transistor, a drain terminal of the fourth transistor is coupled to an output node of the first switching transistor circuit and the second switching transistor circuit, and a source terminal of the fourth transistor is connected to ground.

10. The circuit of claim 1, further comprising a regulator circuit coupled between a common output node of the first and second switching transistor circuits and the power good signal pin of the Southbridge chip.

11. The circuit of claim 10, wherein the regulator circuit comprises two serially connected inverters.

12. A circuit for a computer, comprising:
a Southbridge chip comprising a power good pin, a signal on the power good pin of the chip related to a power up/down sequence of the computer;
a first switching transistor circuit with an input receiving a power good signal and an output connected to the power good pin of the Southbridge chip;
a second switching transistor circuit with an input receiving a S3 sleep signal and an output connected to the power good pin of the Southbridge chip;
wherein when either or both of the power good signal and the S3 sleep signal is/are at low level, the signal on the power good pin of the Southbridge chip is at low level; when both of the power good signal and the S3 sleep signal are at high level, the signal on the power good pin of the Southbridge chip is at high level;
wherein during the power up sequence, the signal on the power good pin of the Southbridge chip is synchronous with the power good signal and conforms to a power up sequence requirement of the computer;

wherein during the power down sequence, the signal on the power good pin of the Southbridge chip is synchronous with the S3 sleep signal for quickly setting the signal on the power good pin of the Southbridge chip to low level and confirming a correct power down sequence.

13. The circuit of claim 12, wherein there is a time delay between the power good signal and the S3 sleep signal.

14. The circuit of claim 12, wherein the first switching transistor circuit comprises a first transistor and a second transistor, one of the first transistor and the second transistor is rendered conductive and another one of the first transistor and the second transistor is rendered non-conductive.

15. The circuit of claim 14, wherein first transistor and the second transistor are both NPN bipolar transistors.

16. The circuit of claim 12, wherein the second switching transistor circuit comprises a third transistor and a fourth transistor, one of the third transistor and the fourth transistor is rendered conductive, and another one of the third transistor and the fourth transistor is rendered non-conductive.

17. The circuit of claim 16, wherein the third transistor is an NPN bipolar transistor, and the fourth transistor is an N-channel enhancement MOSFET.

18. The circuit of claim 12, further comprising a regulator circuit coupled between a common output node of the first and second switching transistor circuits and the power good signal pin of the Southbridge chip.

19. The circuit of claim 18, wherein the regulator circuit comprises two serially connected inverters.

* * * * *